US007417428B2

United States Patent
Hoogenraad et al.

(10) Patent No.: US 7,417,428 B2
(45) Date of Patent: Aug. 26, 2008

(54) FIBRE TRACKING MAGNETIC RESONANCE IMAGING

(75) Inventors: Frank Gerardus Cornelis Hoogenraad, Eindhoven (NL); Arianne Margarethe Corinne Van Muiswinkel, Eindhoven (NL); Ronaldus Frederik Johannes Holthuizen, Eindhoven (NL); Johan Samuel Van Den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/554,354

(22) PCT Filed: Apr. 22, 2004

(86) PCT No.: PCT/IB2004/050486

§ 371 (c)(1), (2), (4) Date: Oct. 24, 2005

(87) PCT Pub. No.: WO2004/095052

PCT Pub. Date: Nov. 4, 2004

(65) Prior Publication Data

US 2006/0241897 A1    Oct. 26, 2006

(30) Foreign Application Priority Data

Apr. 24, 2003    (EP)    ................................. 03101129

(51) Int. Cl.
*G01V 3/00*    (2006.01)
(52) U.S. Cl. ...................... 324/307; 324/309
(58) Field of Classification Search ................. 324/307, 324/309
See application file for complete search history.

(56) References Cited

U.S. PATENT DOCUMENTS

| | | | | |
|---|---|---|---|---|
| 5,969,524 A | * | 10/1999 | Pierpaoli et al. | ............ 324/307 |
| 6,433,547 B2 | | 8/2002 | Kabasawa et al. | |
| 6,463,315 B1 | | 10/2002 | Klingberg et al. | |
| 6,526,305 B1 | * | 2/2003 | Mori | ........................ 600/410 |
| 6,642,716 B1 | * | 11/2003 | Hoogenraad et al. | ........ 324/309 |
| 6,724,190 B2 | * | 4/2004 | van Muiswinkel et al. | .. 324/307 |

(Continued)

FOREIGN PATENT DOCUMENTS

DE    101 12 096 A1    9/2002

(Continued)

OTHER PUBLICATIONS

Conturo, T.E., et al.; Tracking neuronal fiber pathways in the living human brain; 1999; Proc. Natl. Acad. Sci.; 96:10422-10427.

(Continued)

*Primary Examiner*—Brij B Shrivastav
*Assistant Examiner*—Megann E Vaughn

(57) ABSTRACT

A method of deriving a directional structure from an object dataset is proposed. The object dataset assigns local directions to positions in a multidimensional geometrical space. For example the local directions concern local flow directions in a diffusion tensor magnetic resonance image at least one 'region of interest' is selected on the basis of spatial functional information, such as an fMRI image, time correlation of an fMRI image series with a functional paradigm or an anatomical image. These 'region of interest' are employed to initialize a fibre tracking to derive the directional structure that represents the nervous fibre system.

6 Claims, 1 Drawing Sheet

U.S. PATENT DOCUMENTS

| | | | |
|---|---|---|---|
| 6,806,705 B2 * | 10/2004 | van Muiswinkel et al. | .. 324/307 |
| 6,859,203 B2 * | 2/2005 | van Muiswinkel et al. | .. 345/424 |
| 2002/0042569 A1 | 4/2002 | Van Wedeen | |
| 2002/0082495 A1 | 6/2002 | Biswal et al. | |
| 2003/0214290 A1 * | 11/2003 | van Muiswinkel et al. | .. 324/307 |
| 2003/0216634 A1 * | 11/2003 | van Muiswinkel et al. | .. 600/410 |

FOREIGN PATENT DOCUMENTS

| | | |
|---|---|---|
| WO | WO 01/91639 A1 | 12/2001 |

OTHER PUBLICATIONS

Hoogenraad, F., et al.; Analyzing brain function in-vivo using both fMRI and white matter fiber tracking; 2003; Proc. Intl. Soc. Mag. Reson. Med.; 11:1837.

Kim, D-S., et al.; In vivo mapping of functional domains and axonal connectivity in cat visual cortex using MRI; 2003; MRI; 21:1131-1140.

Kim, D.S., et al.; Bridging the Gap Between Functional Neuroimaging and Neuroanatomy; 2002; Soc. for Neuroscience; abstract.

Krings, T. et al.; Three-Dimensional Visualization of Motor Cortex and Pyramidal Tracts Employing Functional and Diffusion Weighted; 2001; Klin Neuroradiol; 105-121.

Mori, S., et al.; Fiber Tracking:principles and strategies-a technical review; 2002; NMR Biomed; 15:468-480.

Mori, S., et al.; Fiber tracking of human brainstem: validity, reproducibility, and tract properties; 2001; Proc. Intl. Soc.Mag. Reson. Med; 9:1519.

Werring, D.J., et al.; A direct demonstration of both Structure and Function in the Visual System; 1999; Neurolmage; 9:352-361.

* cited by examiner

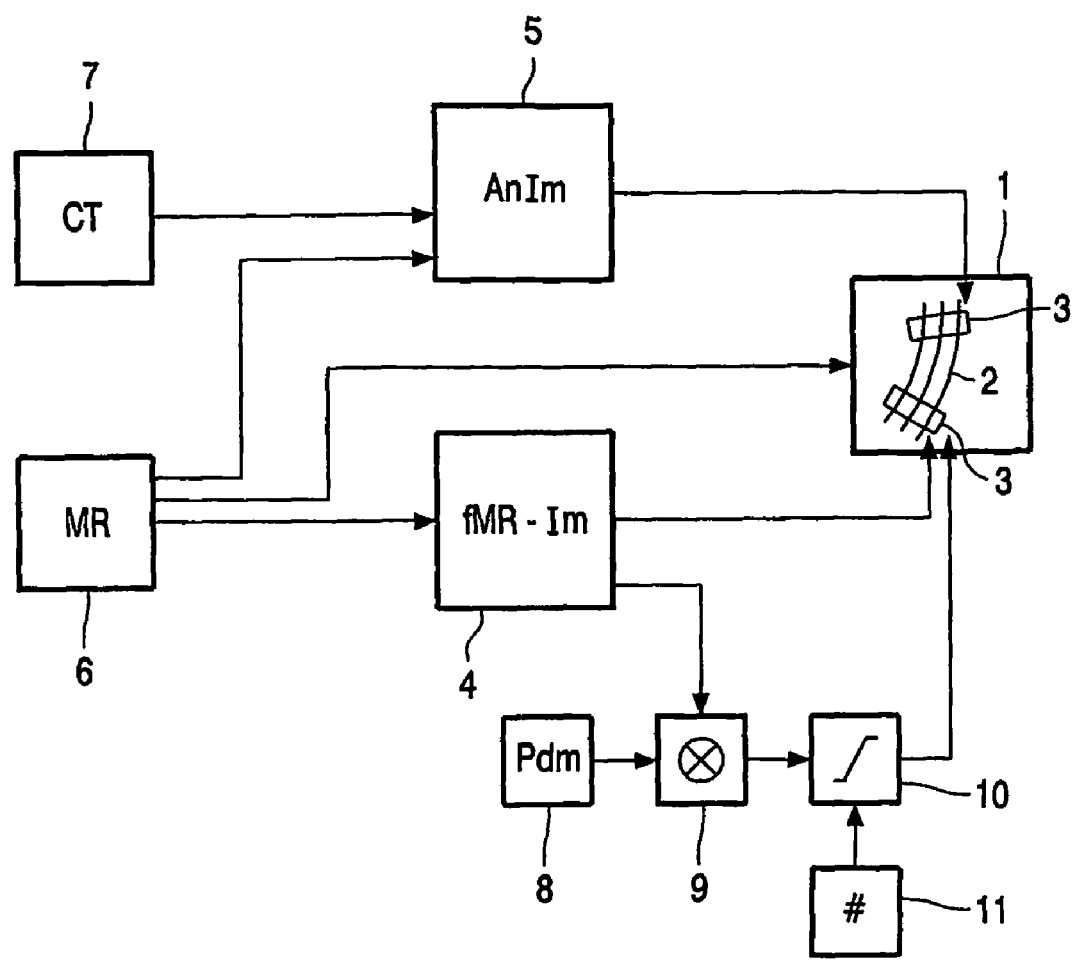

FIBRE TRACKING MAGNETIC RESONANCE IMAGING

The invention pertains to a method of deriving a directional structure from an object dataset.

Such a method is known from the international application WO 01/91639.

The known method concerns a reconstruction of an image of brain fibers from diffusion weighted magnetic resonance images with various diffusion sensitizing gradient combination and strengths. This representation of the brain fiber structure forms the directional structure. The image information of the diffusion weighted magnetic resonance images is made available in the form of pixels. The intensity of individual pixels are fitted to calculate six independent variables in a 3×3 diffusion tensor. The diffusion tensor is then diagonalized to obtain three eigenvalues and the corresponding three eigenvectors. These eigenvectors represent the local direction of the brain fibre structure at the pixel at issue. Accordingly, the diffusion weighted magnetic resonance images assign the local direction of the brain fibers to positions in the brain.

The known method employs fibre tracking to establish the brain fibre structure. The fibre tracking employed in the known method consists of three parts: initiation of brain fibre tracking, pixel connecting and judgement of the termination of the fibers. Tracking of projections of fibers is initiated in a three-dimensional space arbitrarily chosen by the user and propagated in both directions according to the direction of the fibre (the eigenvector associated with the largest eigenvalues. Each time the tracking laves a pixel to the next pixel, judgement is made whether the fibre is continuous or terminated based on randomness of the fibre orientation of the adjacent pixels.

An object of the invention is to provide an method of deriving a directional structure which requires less computational effort than the known method.

This object is achieved by the method of deriving a directional structure according to the invention which comprises the steps of
- selecting at least one region of interest in the multi-dimensional geometrical space on the basis of spatial functional information
- selecting candidate positions in the selected region of interest
- establish the directional structure on the basis of
  - dominant local directions at the candidate positions and
  - relative locations of these candidate positions in the multi-dimensional geometrical space.

The object dataset represents directional information concerning an object being examined. In particular the object is a patient to be examined and the examination relates to the patient's brain and nervous system. For example the directional information concerns local direction of anisotropic water diffusion in the brain and nervous system. From the object dataset the directional structure is established on the basis of dominant local directions. When applied to the patients brain and nervous system, this directional structure represents the way the axonal tracks are organized and allows study of the spatial architecture of white matter tracts. Establishing of the directional structure can be achieved by so-called fibre tracking algorithms. These fibre tracking algorithms are known as such from the review article '*Fiber tracking: principles and strategies—a technical review*' in NMR Biomed. 15(2002)468-480 by S. Mori and Peter C. M. van Zijl. Fibre tracking involves reconstruction of the directional structure by following the local dominant direction from several candidate positions or seed points. In order to avoid an exhaustive search involving all positions in the geometrical space as candidate positions, the selection of candidate positions is limited to one or a few 'regions of interest'. The invention achieves a further improvement in the efficiently of selecting candidate positions in that with a low number of candidate positions, a quite complete reconstruction of the directional structure of interest. To this end, the 'region of interest' is selected on the basis of spatial functional information that relates to the same object and the object dataset itself.

These and other aspects of the invention will be further elaborated with reference to the embodiments defined in the dependent Claims.

Preferably, said spatial functional information is represented by functional magnetic resonance image(s) that represent the functioning of the brain and nervous system. For example, the 'regions of interest' are chosen as regions where brain activity at issue shows up in the functional image.

Further improvement of the efficiency of the selection of the candidate positions is achieved in that the 'regions of interest' are selected on the basis of a correlation of a paradigm and the functional magnetic resonance image that is acquired during performance of the paradigm. Such a paradigm concerns a task set to the patient to be examined, such as finger tapping or viewing a pattern.

In a further preferred implementation the correlation of the functional magnetic resonance image with the paradigm is compared to a pre-set threshold for several positions in the geometrical space. The 'regions of interest' are then selected on the basis of areas in the geometrical space where the correlation exceeds the pre-set threshold. In this way it appears that the 'regions of interest' can be selected automatically. These thus selected 'regions of interest' are very efficient in that the directional structure is accurately reconstructed on the basis of a small number of candidate positions.

The invention further relates to a workstation as defined in Claim 8. The workstation of the invention is arranged to receive the object dataset, such as in the form of DTI-images and is further arranged to perform the method of the invention. The invention also relates to a computer program as defined in Claim 9. The computer program of the invention can be provided on a datacarrier such as a CD-rom, but may also be downloaded from a data-network such as the world-wide web. When the computer program is downloaded to the working memory of a workstation, the instructions in the computer program cause the workstation to perform the method of the invention.

These and other aspects of the invention will be elucidated with reference to the embodiments described hereinafter and with reference to the accompanying drawing wherein FIG. 1 shows a diagrammatic representation of the method according to the invention.

In the diagrammatic representation of the method as shown in FIG. 1, the object dataset is formed by a diffusion tensor magnetic resonance image dataset 1 (DTI-dataset). The DTI-image is generated from an magnetic resonance imaging system 6. The DTI-dataset 1 represents locally main flow directions of anisotropic flow of in white brain tissue. The DTI-dataset 1 may be a three-dimensional image which assigns in its voxels the local main flow direction to a position in three-dimensional volumetric space. The DTI-dataset 1 can be applied to a monitor in order to display a DTI-image. To the DTI-dataset a fibre-tracking algorithm is applied to derive from the DTI-image the directional structure 2 in the form of a fibre structure which is a representation of the nervous fibre system of the patient to be examined. In order to avoid an exhaustive search involving all positions in the geometrical space as candidate positions, the selection of candidate positions is limited to one or a few 'regions of interest' 3. Initial candidate positions to search for fibers in the DTI-dataset are selected in the 'regions of interest' As the fibre structure is being formed, additional candidate points are chosen near the current fibre structure as it is being built up. The 'regions of interest' 3 are selected on the basis of functional information. Such functional information is for example obtained from a functional magnetic resonance image (fMRI-image) 4. The fMRI-image is for example generated during the same examination of the patient to be examined in the magnetic resonance imaging system 6. This fMRI-image shows local regions of activity in for example the patient's brain. According to the invention, the 'regions of interest' are selected as regions in which there is brain activity visible in the fMRI-image. Accordingly, the fibre system connecting these region of brain activity are easily derived from the DTI-image 1. Notably, spurious efforts in fibre tracking any fibers that are irrelevant for the connection of the brain regions at issue are avoided. The 'regions of interest' 3 may be derived also from an anatomical image 5, as an alternative to or together with the use of the fMRI to support the selection of the 'regions of interest'. The anatomical image 5 may be generated by the magnetic resonance imaging system 6, but may also be generated by another imaging modality, such as a computed-tomography system 7. From the anatomical image 5, the relevant regions of the anatomy, such as the brain, which relate to particular nervous functions are shown. Also tumors be visible from the anatomical image and or form the fMRI image and the 'region of interest' are then easily selected to correspond to these tumors and the Thus, also the anatomical image includes functional information that is useful to support the selection of the 'regions of interest' 3.

Often, a time series of fMRI-images is formed. The image information in the successive fMRI-images, e.g. as represented by the brightness values, is preferably correlated with a paradigm that is exercised by the patient to be examined. Such a paradigm nay involve a task, such as finger tapping or viewing a simple optical pattern that has a simple variation in time. In a correlation step 9, a time-correlation of the paradigm 8 with the fMRI-images 4 is computed. Subsequently, in a comparison step 10, the time-correlation is compared to a threshold value 11. This threshold value 11 may be input or adjusted by the user, or may have been stored in advance. Portions of the fMRI-images in which the time-correlation with the paradigm exceeds the threshold are automatically designated as 'regions of interest'. Notably these portions of the fMRI-image relates to areas where there is substantial nervous activity. The functions of the method of the invention are in practice performed by means of a workstation in which a computer program with instructions to perform these functions is loaded.

The invention claimed is:

1. A method of deriving a directional structure from a diffusion tensor magnetic resonance imaging object dataset, the method comprising the steps of:
   selecting at least one region of interest in the multi-dimensional geometrical space on the basis of spatial functional information, the spatial functional information including information derived from a functional magnetic resonance image data;
   selecting candidate positions in the selected region of interest;
   establishing the directional structure on the basis of:
      dominant local directions at the candidate positions, and
      relative locations of these candidate positions in the multi-dimensional geometrical space, wherein the at least one region of interest is determined on the basis of the functional magnetic resonance image; and
   generating an image based on the directional structure.

2. A method of deriving a directional structure as claimed in claim 1, wherein,
   two or more regions of interest are selected and the candidate positions are selected in said regions of interest, and
   the directional structure is established in as far as passing through the selected regions of interest.

3. A method of deriving a directional structure as claimed in claim 1, wherein further candidate positions are selected on the basis of a currently established directional structure.

4. A method of deriving a directional structure as claimed in claim 1, wherein further candidate positions are selected in a neighborhood of at least one of the regions of interest.

5. A method of deriving a directional structure from a diffusion tensor magnetic resonance imaging object dataset, the method comprising:
   selecting at least one region of interest in the multi-dimensional geometrical space on the basis of spatial functional information the spatial functional information including information derived from a functional magnetic resonance image data, the selecting including forming a correlation of the functional magnetic resonance image with a pre-determined paradigm and determining the at least one region of interest on the basis of said correlation;
   selecting candidate positions in the selected region of interest;
   establishing the directional structure on the basis of:
      dominant local directions at the candidate positions, and
      relative locations of these candidate positions in the multi-dimensional geometrical space, wherein the at least one region of interest is determined on the basis of the functional magnetic resonance image; and
   generating an image based on the directional structure.

6. A method of deriving a directional structure as claimed in claim 5, wherein,
   the correlation of the functional magnetic resonance image with a pre-determined paradigm is compared to a pre-set threshold, and
   at least one region in the functional magnetic resonance image is selected where the correlation exceeds the pre-set threshold;
   the at least one region of interest is determined on the basis of said selected region in the functional magnetic resonance image.

* * * * *